United States Patent
Seväkivi

(10) Patent No.: US 7,274,573 B2
(45) Date of Patent: Sep. 25, 2007

(54) ASSEMBLY FOR INSTALLATION OF POWER ELECTRONICS MODULES AND INSTALLATION METHOD

(75) Inventor: Pertti Seväkivi, Lepsämä (FI)

(73) Assignee: ABB Oy, Helsinki (FI)

( * ) Notice: Subject to any disclaimer, the term of this patent is extended or adjusted under 35 U.S.C. 154(b) by 422 days.

(21) Appl. No.: 10/512,499

(22) PCT Filed: Mar. 25, 2004

(86) PCT No.: PCT/FI2004/000175

§ 371 (c)(1), (2), (4) Date: Oct. 26, 2004

(87) PCT Pub. No.: WO2004/086836

PCT Pub. Date: Oct. 7, 2004

(65) Prior Publication Data

US 2005/0174741 A1 Aug. 11, 2005

(30) Foreign Application Priority Data

Mar. 27, 2003 (FI) .................................. 20030458

(51) Int. Cl.
*H05K 7/20* (2006.01)
(52) U.S. Cl. ...................... 361/721; 361/690; 361/716; 312/265.5; 211/183
(58) Field of Classification Search ................. 361/721
See application file for complete search history.

(56) References Cited

U.S. PATENT DOCUMENTS

| | | | |
|---|---|---|---|
| 3,280,377 A | 10/1966 | Harris et al. | |
| 3,780,798 A | 12/1973 | Reimer | |
| 4,748,540 A * | 5/1988 | Henneberg et al. | 361/687 |
| 5,283,716 A | 2/1994 | Banitt et al. | |
| 5,745,342 A * | 4/1998 | Jeffries et al. | 361/683 |
| 6,082,845 A * | 7/2000 | Eizadkhah et al. | 312/323 |
| 6,504,714 B1 * | 1/2003 | Richter | 361/695 |
| 6,504,730 B1 | 1/2003 | Cooney et al. | |
| 6,704,198 B2 * | 3/2004 | Replogle et al. | 361/690 |
| 2002/0141156 A1 | 10/2002 | Edmunds et al. | |

FOREIGN PATENT DOCUMENTS

JP 5-267860 A 10/1993

\* cited by examiner

*Primary Examiner*—Lisa Lea-Edmonds
(74) *Attorney, Agent, or Firm*—Birch, Stewart, Kolasch & Birch, LLP

(57) ABSTRACT

A method and assembly for mounting power electronics modules in an equipment cabinet, cubicle or other like equipment space. According to the invention, the power electronics modules are mounted in the equipment space (1) with the help of mounting bases (3), such that the mounting bases (3) comprise fixture means (13, 14) for fixing the mounting base in the equipment space (1) and a mounting plate (16) fixed supportedly by the fixture means (13, 14) so that the first end of the mounting plate is situated closer to the fixture means (14) of the first end than the opposite end (11) of the mounting plate (3) from the fixture means (13) of this opposite end, whereby the mounting plate (16) becomes aligned in a slanted position in the equipment space.

9 Claims, 2 Drawing Sheets

ASSEMBLY FOR INSTALLATION OF POWER ELECTRONICS MODULES AND INSTALLATION METHOD

The present invention relates to an assembly according to the preamble of claim 1 for uncomplicated and efficiently coolable installation of power electronics modules into an equipment cabinet, cubicle or other like equipment space.

The invention also relates to an installation method utilizing the assembly.

The design of frequency converters and inverters can be broken down into modules of different sizes suitable for implementing the drive systems of electrical equipment. Really large numbers of power modules may be needed in industrial installations and massive transportation vehicles such as ships. Conventionally, such power electronics modules are assembled into groups in equipment cabinets or other like equipment spaces that can be provided with such supportive functions as sufficiently rigid mounting of the modular units, as well as their cooling, electrical interference filtration or suppression and required electrical and communications connections. Obviously, power modules must be manufactured in various size formats for different power levels. The largest power modules may have a weight in excess of 20 kg. Conventionally, frequency converter and inverter modules are secured on a common mounting plate attached to the rear wall of the equipment cabinet or cubicle. The heat resulting from the internal power losses of the modules is ventilated with the help of a separate air flow guide baffle to the rear side of the cabinet. The modules are convection-cooled by air, and each module is equipped with a fan that induces a sufficient air flow.

This kind of prior-art arrangement requires the use of a mounting plate, whereon the power modules are assembled, plus an individual air flow guide baffle for each one of the units. As the mounting plate must be fabricated separately for each group of modules, the construction cannot be assembled from individual modules of small size, but instead, the system design is constrained to use standardized layouts in order to keep the number of different mounting plates to a minimum. Inasmuch as the air flow guide baffle is installed above the modules where it directs the cooling air flow to travel behind the mounting plate in the rear side of the cabinet, the ventilation pathway becomes crooked and creates turbulent crossing flows that invoke pressure losses in the air flow. The connections to the modules must be made deep in the cabinet interior, whereby later access to the connections becomes complicated. As a result, the installation and, in particular, service of the system become awkward operations. The modules must be lifted in a vertically upright position deep into the cabinet meaning that the lifting posture is unergonomic and the module need be upheld in a tedious position until support to the module has been secured with the help of mounting fixtures. As a result, difficulties are encountered, particularly in the installation of the heaviest modules. Gaining access to the cooling fan of the module becomes very difficult, because the cooling fan is situated in the lower part of the ready-installed module and, furthermore, the gap between two superposed modules may be narrow and also the air flow guide baffle consumes some space between the units. However, inasmuch the cooling fan is one of the few wearing parts of the system hence needing servicing, the fan maintenance and replacement should be made easy. Since sufficient space must be left between the modules for easy installation and servicing, the packaging density of cabinets remains low and, in locations equipped with a great number of power electronics modules, the space requirement of cabinets becomes large.

It is an object of the invention to provide an assembly capable of permitting the mounting of power electronics modules in an equipment space in a fashion easier than in the prior art and facilitating more efficient cooling of the modules.

The goal of the invention is achieved by way of mounting the power electronics modules in the equipment space with the help of mounting bases, the mounting bases including fixture means for securing the mounting base in the equipment space and a planar mounting base element adapted supportable by the fixture means and having its first end extending to a shorter distance from the first end fixture means than what the opposite, second end of the planar element extends from the second end fixture means thus aligning the planar mounting base element in a slanted position in the equipment space.

More specifically, the assembly in accordance with the invention is characterized by what is stated in the characterizing part of claim 1.

Furthermore, the method in accordance with the invention is characterized by what is stated in the characterizing part of claim 9.

The invention offers significant benefits.

In addition to acting as a mounting base, the mounting plate delineates a ventilation duct that passes the heat resulting from the internal power losses of the mounted module out from the equipment space. The mounting plate forms a self-contained, single-module-supporting structure thus allowing different modules to be installed in the same cabinet in a desired layout stacked above one another up to such a number that fills the entire available mounting space. Due to their slanted mounting position, a greater number of modules may be stacked above one another in an equipment cabinet of a given as compared with the prior-art mounting layouts, whereby the packaging density of an equipment space is improved. Connections to the modules can be made easier by virtue of the less complicated access to the connector terminals. Also the lifting-in of the modules is eased substantially. During the installation of a module into a cubicle or cabinet, the upper end of the module is first placed on the lower fixing point of the mounting plate and simultaneously the module upper end is aligned onto the guide rails provided at the opposite edges of the mounting plate, whereby the module is safely supported and can be pushed along the guide rails into its proper position. Lifting the module can be performed from the exterior side of the cabinet and the module need not be upheld after it has been pushed home.

As the modules rest on the support surface of the cabinet in a slanted position with their lower end extending outwardly, access to the cooling fans situated in the lower end of the modules is easy thus facilitating quick servicing or replacement thereof. As a result, the equipment downtime due to maintenance of fans remains short, the cooling air duct becomes straight and air subflows from modules are oriented in the same direction as the main flow thus reducing pressure losses in the cooling air duct to a minimum. This advantage increases the overall cooling capacity or, conversely, allows the use of smaller fans. Due to the optimal position of the modules, hot air cannot rise upward within the component-side space of the equipment cabinet/cubicle, but rather, each module receives its cooling air substantially at the same intake temperature.

In the following, the invention is examined in greater detail by making reference to the appended drawings in which FIG. 1 is a side elevation view of an equipment cabinet having mounting plates according to one embodiment of the invention mounted therein;

In the diagrams described below, the equipment cabinet is outlined as a frame structure only. Conventionally, a cabinet also includes wall panels that give the frame structure a desired degree of protection from the environment. However, the invention is as well suited for installations in an open space such as mounting of equipment on a wall, for instance.

Figure 4:
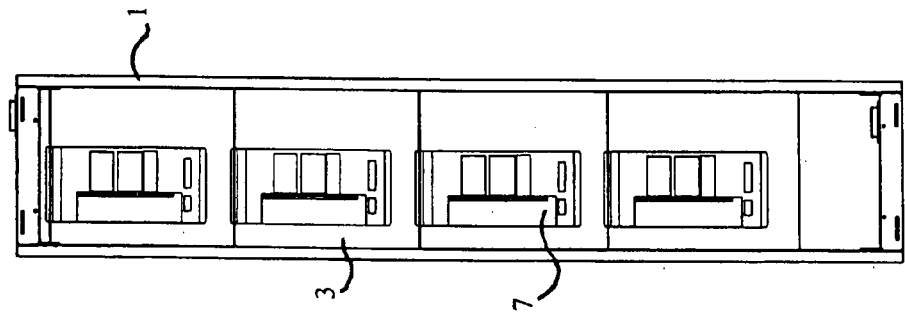
FIG. 4 is a front elevation view of the equipment cabinet of FIG. 3.
Figure 3:
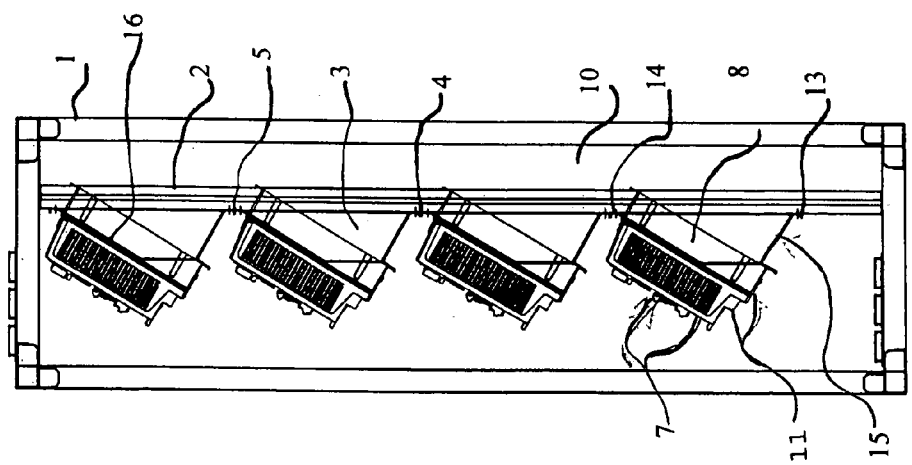
FIG. 3 is a side elevation view of an equipment cabinet having mounting plates according to one embodiment of the invention with power electronics modules mounted therein.
Figure 2:
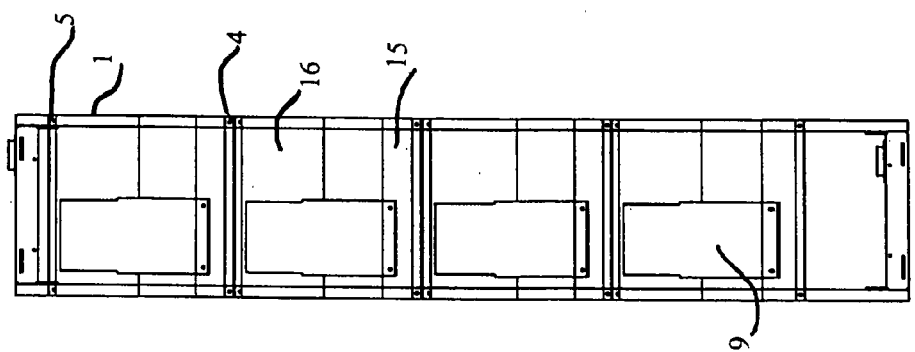
FIG. 2 is a front elevation view of the equipment cabinet of FIG. 1.
Figure 1:
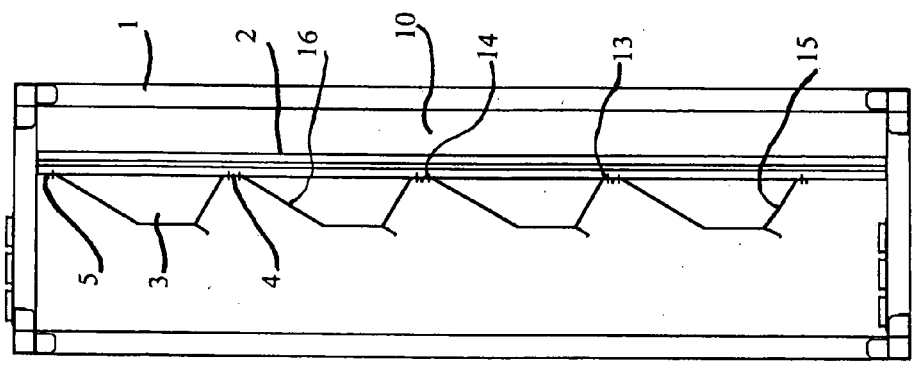

The frame of an equipment cabinet comprises an open rack frame 1 defining the dimensions of the cabinet and support columns 2 adapted to both sides of the frame, at a distance from the rear wall of rack frame 1. The mounting plates 3 are fixed on the support column 2 with screws 4, 5 at the upper and lower ends of mounting plate 3. The mounting plates 3 are assembled in a stacked fashion and, while they in this exemplary embodiment are illustrated as being of the same size, it is obviously also possible to equip a single equipment cabinet with mounting plates 3 of different sizes in the case that mounting bases need to be provided for modules of different sizes. In FIG. 3, the modules 7 are shown ready-installed. The power electronics modules 7 are installed in an opening 9 made on each one of the mounting plates. As is illustrated in FIG. 3, the electronics part of the modules is located in the interior of the cabinet, while the cooling part comprising the cooler elements becomes recessed below the mounting plate so as to face the unconstricted cooling air duct 10. The lower part of the mounting opening 9 forms an inlet opening of a module-specific cooling air channel that passes the cooling air directly into the cooling air duct 10. As the rear side of the mounting plate 3 is open, the flow channel is free from constrictions and, hence, the air flow pressure losses remain low. The advantageous location of the cooling fans of modules 7 at the lower end of the modules in their mounted position allows easy servicing of the fans, since the lower part of each module extends outwardly longer from the rear wall of the module than the upper end of the next module below that is close to the rear wall. FIG. 3 further shows that modules already mounted in place cause no hindrance to the installation or replacement of other modules. The cooling air flow of one module also sweeps over the top side of the next module below thus also performing the cooling of the electronics component side of this module.

Figure 6:
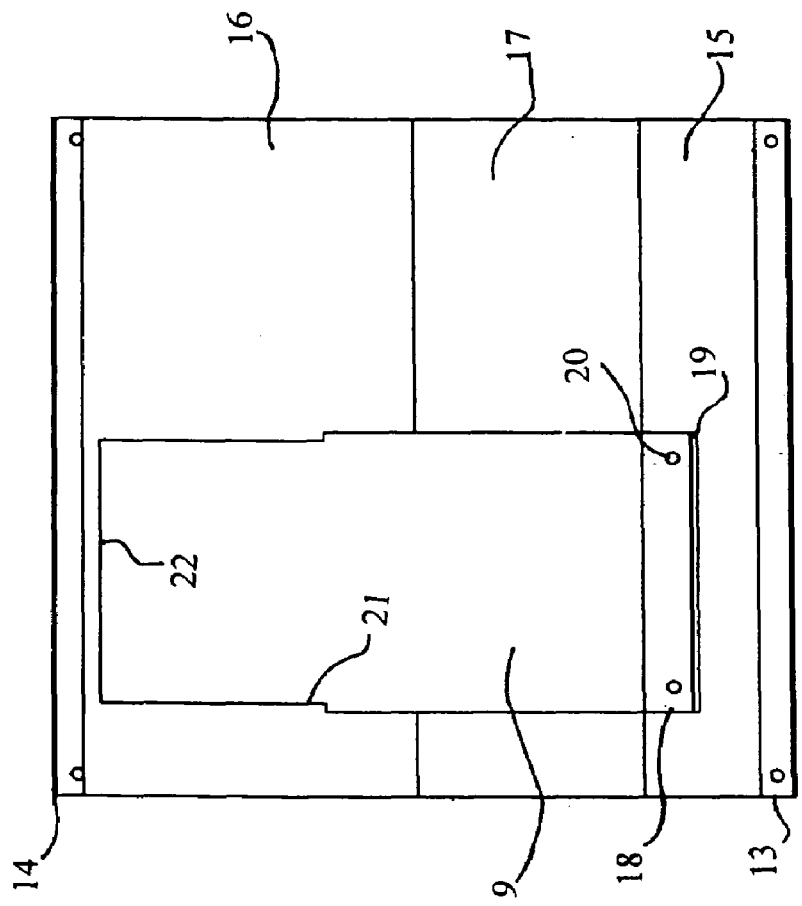
FIG. 6 is a front elevation view of an embodiment of the mounting plate.
Figure 5:
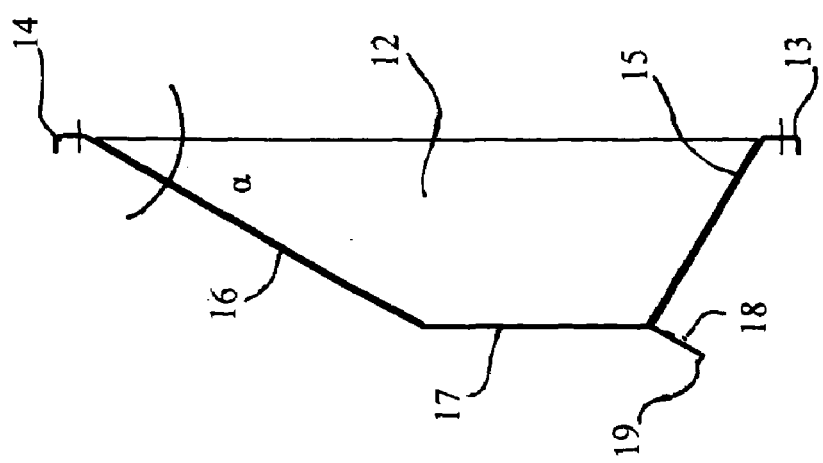
FIG. 5 is a side elevation view of an embodiment of the mounting plate.

The mounting plate 3 is illustrated in FIGS. 5 and 6. Incorporated in the mounting plate are two mounting lug edges 13, 14 that are situated in the same plane. During installation, the mounting lug edges 13, 14 are fixed against a support column or other vertical support surface. Starting from the lower mounting lug edge 13, a lower slanted plane 15 extends outwardly from the plane of the mounting lug edges, while an upper slanted plane 16 extends in the same outward direction starting from the upper mounting lug edge 14. The angle a between the upper slanted plane 16 and the plane of the mounting lug edges is advantageously 20°. The outward edges of the upper and lower slanted planes are connected to each other by a straight plane 17 parallel to the plane of the mounting lug edges 13, 14.

The mounting opening 9 is made on the vertical straight plane 17 and the upper slanted plane 16 so that it extends from the bent corner between the lower slanted plane 15 and the vertical straight plane 17 almost as high as the bent corner between the upper slanted plane 16 and the upper mounting lug edge 14. The mounting opening 9 from the bent corner between the lower slanted plane 15 and the vertical straight plane 17 toward the upper slanted plane 16 has a constant width adapted to accommodate the width of the module to be installed. A portion of the inner edges of the opening made on the upper slanted plane 16 is provided with guide rails 21 extending over a given length along the opening. At the bent corner between the vertical straight plane 17 and the lower slanted plane 15, from the edge of the mounting opening 9 projects a support bracket 18 aligned parallel to the upper slanted plane 16. At the end of the support bracket 18 is bent an edge 19. The distance from the support bracket bent edge 19 and the opposite edge 22 at the other end of the mounting opening is made equal to the length of the module to be mounted. The perpendicular distance between the support bracket 18 and the upper slanted plane is adapted to accommodate the height of the cooling element 8 of the module. The support bracket includes mounting holes 20 for the mounting lugs of module 7.

The mounting plate is complemented into a bottom-open enclosure by sidewalls 12. After the mounting plate is fixed to the support columns 2 of the cabinet and has a compatible module 7 mounted thereon, the sidewalls define an enclosure opening toward the cooling air duct 10. The thus formed enclosure provides sufficient space for making connections to the module.

The installation of the modules takes place by way of first securing the mounting plate 3 in place with the help of fixing screws 4, 5. Next, the upper end of the module 7 is elevated higher and placed resting on the support bracket 18 and simultaneously the module 7 is pushed upward so as to fit the grooves at the sides of the module to mate with guide rails 21. With further pushing of the module 7 upward, it meets the upper edge 22 of the mounting opening, whereby the corner of the lower end 11 of the module has passed over the bent edge 19 of the support bracket 18. Now the module 7 can be released to rest against the support bracket bent edge 19 in which position the module stays firmly supported by the guide rails 21 and the support bracket 19. Next, the module can be secured at mounting holes 20 by screws, whereby a greater number of mounting holes may be employed if necessary. As the module needs no manual support during the insertion of the fixing screws, the module is easy to fix in place.

In addition to those described above, the invention has alternative embodiments.

The simplest realization of the invention comprises a plate with a mounting opening, the plate being appropriately shaped for fixing in a selected location of a cabinet in such a fashion that the first edge of the mounting plate remains closer to the support surface of the plate than the second edge of the plate at the opposite end of the plate. The modules themselves may then be fixed on conventional mounting lugs, for instance. This embodiment is handicapped by the need for upholding support to the module until its fixing screws have been inserted/tightened in place. While the above-described embodiment may even be implemented so that the support bracket 18 and its bent edge are omitted, even this arrangement makes the installation more complicated. Alternatively, the guide rail 21 may be replaced by a groove or other guide if the module is respectively provided with a guide rail. However, the guide rail is easiest to form on a mounting plate manufactured from a sheet material. While the mounting plate advantageously made by bending/pressing from sheet metal, the manufacturing technique used in making the mounting plate is not crucial in the implementation of the invention. It may be further contemplated, particularly for lightweight modules, that the mounting plate is secured only at its upper end, but this arrangement is possible only if the mounting plate structure is sufficiently rigid to support the module weight. Obviously, no contiguous cooling air duct is created herein. It may be moreover contemplated that an open-frame type mounting frame is used in lieu of the mounting plate, but also this arrangement fails to provide cooling air circulation without resorting to separate air flow guide baffles.

What is claimed is:

1. An assembly for mounting power electronics modules in an equipment cabinet, cubicle or other like equipment space, the assembly comprising a mounting base (3) incorporating first fixture means (13, 14) for fixing the mounting base (3) on a support surface (2) and second fixture means (18, 19, 20, 21) for fixing a power electronics module (7) on the mounting base (3), wherein said second fixture means (18, 19, 20, 21) are adapted at a distance from said first fixture means (13, 14) so that a first end of the module (7) to be fixed on said mounting base (3) becomes situated closer to said support surface (2) than the opposite end (11) of the module relative to said first end, characterized by an opening (9) made in the mounting base for adapting a power electronics module therein so that the cooling part of the electronics module becomes recessed below the mounting plate.

2. The assembly of claim 1, characterized in that the upper end of the module (7) to be fixed becomes closer to said support surface (2) than the lower end (11) of the module.

3. The assembly of claim 1 or 2, characterized in that said mounting base is a mounting plate (3) comprising at least a first slanted plane (16) projecting outwardly from the plane of said first fixture means (13, 14) so as to form an angle ($\alpha$) with the plane defined by said first fixture means (13, 14).

4. The assembly of claim 3, characterized in that the opening (9) for adapting a power electronics module therein is made in said first slanted wall (16).

5. The assembly of claim 3 or 4, characterized in that said mounting plate (3) comprises a first slanted plane (16), a second slanted plane (15), the latter extending in a slanted fashion from the plane of said first fixture means (13, 14) toward the first slanted plane (16), and an upright plane (17) that connects said slanted planes and is mounted parallel to the plane of said first fixture means (13, 14).

6. The assembly of claim 4 or 5, characterized by a mounting opening (9) having its first edge coinciding with the bend between said second slanted plane (15) and said upright plane (17), while the second edge (22) opposite to said first edge is situated within the area of said first slanted plane (16).

7. The assembly of any one of claims 4-6, characterized by guide rails (21) that are adapted to both opposite sides of said mounting opening (9) and extend over a given length of said edges (22).

8. The assembly of any one of claims 4-7, characterized by a support bracket (18) having a bent edge (19) made at its distal edge and being situated at said mounting opening (9), at the bend between said second slanted plane (15) and said upright plane (17), the plane of said support bracket being parallel to said first slanted plane (16) and extending outwardly from said mounting opening.

9. A method of installing power electronics modules in an equipment cabinet, cubicle or other equipment space, the method comprising the steps of fixing in place a mounting plate (3) such as is specified in any one of claims (4-8), elevating the upper end of the module (7) into a position supported by the support bracket (18) of the mounting plate, pushing the module (7) upward in such as fashion that the grooves made at the sides of the module slide along the guide rails (21) provided in the mounting opening (9) of the mounting plate (3), pushing the module (7) further upward until it meets the edge (22) of the mounting opening and the corner of the module lower end (11) has passed over the bent edge (19) of the support bracket (18), lowering the module (7) to rest against the bent edge (19), and securing the module (7) to the mounting plate (3).

* * * * *